Oct. 4, 1960 H. P. LUHN 2,955,236

PRINTED CIRCUIT PACKAGE

Filed Dec. 24, 1956 5 Sheets-Sheet 1

*INVENTOR.*
HANS P. LUHN

*BY* John E. Dougherty Jr

ATTORNEY

Oct. 4, 1960

H. P. LUHN 2,955,236

PRINTED CIRCUIT PACKAGE

Filed Dec. 24, 1956

5 Sheets-Sheet 2

Oct. 4, 1960

H. P. LUHN 2,955,236

PRINTED CIRCUIT PACKAGE

Filed Dec. 24, 1956

5 Sheets-Sheet 4

Oct. 4, 1960 H. P. LUHN 2,955,236

PRINTED CIRCUIT PACKAGE

Filed Dec. 24, 1956 5 Sheets-Sheet 5

United States Patent Office 2,955,236

Patented Oct. 4, 1960

2,955,236

PRINTED CIRCUIT PACKAGE

Hans P. Luhn, Armonk, N.Y., assignor to International Business Machines Corporation, New York, N.Y., a corporation of New York Filed Dec. 24, 1956, Ser. No. 630,275

12 Claims. (Cl. 317—101)

The present invention relates to the packaging of printed circuit and printed wiring components and more particularly to a three dimensional package of a plurality of intersecting printed circuit and printed wiring boards wherein all connections between the circuits on the boards may be easily soldered and the solder connections are readily accessible for maintenance and repair.

Copending application Serial No. 630,102, filed December 24, 1956, in behalf of E. R. Wyma, discloses a novel three dimensional package of intersecting perpendicularly arranged printed wiring boards which may be employed to supply the back panel wiring to and between printed circuit component boards such as are used in large scale electronic computing equipment. The printed circuit component boards employed in the arrangement of the copending application are connected to the three dimensional back panel wiring structure by means of spring connectors and, since they may be removed and inserted at will, are properly termed pluggable units. In order that the points of electrical connection be accessible for servicing and maintenance, printed wiring paths are provided from the spring connectors to the back of the back panel wiring assembly. Pluggable unit connections of this type have been found to be satisfactory for most electronic applications up to this time but as the speed of operation of computing equipment has been increased and the magnitude of signals decreased by the utilization of improved solid state elements such as transistors, it has been found that, for reliable operation over long periods, spring connectors of the normal type are not completely satisfactory.

A prime object of the present invention is to provide an improved three dimensional printed circuit assembly capable of reliable performance in small signal, high frequency electronic equipment.

A further object is to provide a multidimensional printed circuit package wherein all connections are soldered and are yet accessible for maintenance and repair.

Still another object is to provide an improved method of achieving reliable solder connections and means for simultaneously soldering a plurality of connections in accordance with this method.

In carrying out these objects, as is shown in the embodiment of the invention herein disclosed by way of illustration, a three dimensional arrangement of intersecting mutually perpendicular printed wiring boards, such as is disclosed in the above mentioned copending application, is employed. For a complete explanation of this novel open type three dimensional printed back panel wiring structure, reference should be made to the copending application which is, by these references thereto, incorporated as a part of the subject application. In order to achieve solder connections between the component circuit boards and the back panel assembly and still preserve as much as possible the advantages of the pluggable unit type construction, the component circuit boards are provided with a plurality of slots so that they may be fitted, in interdigitated fashion, into the printed back panel wiring assembly. The back panel assembly includes first and second groups of mutually perpendicular printed wiring boards and the component boards are arranged parallel to the boards in the first group with their slotted portions fitted over the boards in the second group. The component boards and the boards in the first group are each provided with reed like connectors which extend outwardly of the rear of the assembly. The reeds on the component boards are, when the package is assembled, aligned with reeds on the boards in the first group. The aligned reeds are biased so that they are normally separated by a small distance but are coated with solder so that they may be held together and subjected to heat to fuse the reeds together. A special tool which includes a linear heat source may be employed to effect the fusion of a plurality of aligned reeds in a single operation. This tool comprises a tubular heat lamp which is mounted along one focus line of an elliptical cylindrical reflecting surface. The tool is provided with a pair of clamps which grasp a group of the aligned reeds with the tinned portions along a line coincident with the second focal line of the elliptical reflector. The reeds are first clamped together; then the lamp is actuated and the heating rays therefrom are concentrated along the line in which the clamped reeds lie causing the reeds to be fused. The lamp is then extinguished and, after sufficient time for cooling, the clamps are opened. The bias of the reeds is such that, where the electrical connections effected during the fusing operation are not proper, they will fly apart thereby giving a visible indication of the failure.

Thus a further object of the invention is to provide an open type interdigitated printed circuit package.

A further object is to provide an improved package including first and second groups of intersecting printed wiring boards for supporting and supplying back panel wiring for a plurality of printed circuit component boards wherein the component boards are mounted on the front side of the assembly of printed wiring boards but have finger-like extensions which extend through the printed wiring assembly so that all the connections between back panel wiring boards and component circuit boards may be made at the rear of the assembly.

A further object of the invention is to provide a novel method of effecting soldering.

Another object of the invention is to provide a special tool for soldering a plurality of connectors in acordance with this novel mode in a single operation.

Another object of the invention is to provide a novel method of achieving reliable solder connections wherein the connectors to be soldered are normally biased away from each other and are fused together by the solder without any further mechanical connection so that improper solder connections result in the connectors flying apart and thereby giving a visible indication of the failure.

Other objects of the invention will be pointed out in the following description and claims and illustrated in the accompanying drawings, which disclose, by way of example, the principle of the invention and the best mode, which has been contemplated, of applying the principle.

Figures 5A, 5B, 5C, 5D:
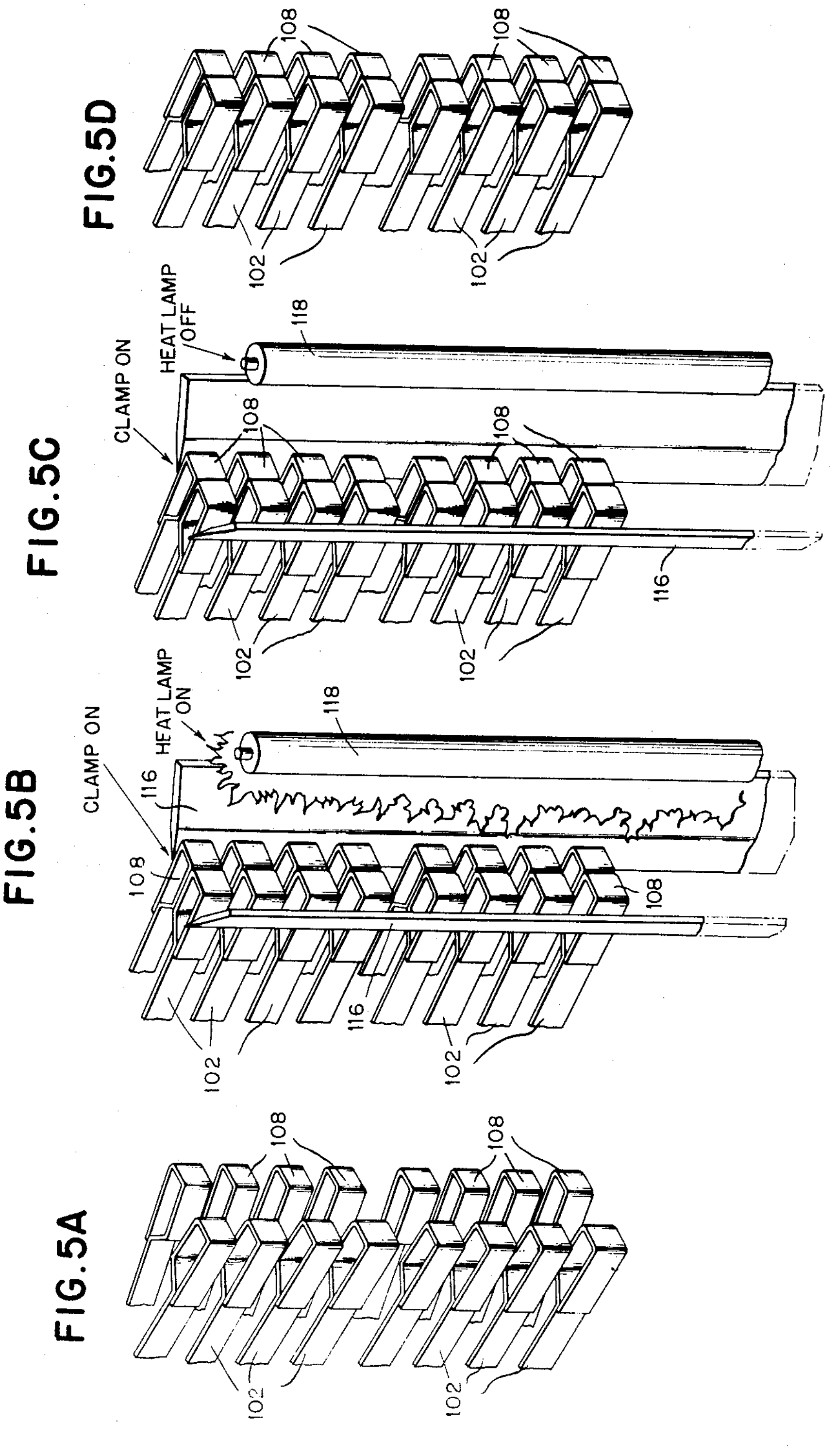

Figs. 5A, B, C and D illustrate the steps in fusing a plurality of aligned connecting reeds.

Figure 6:
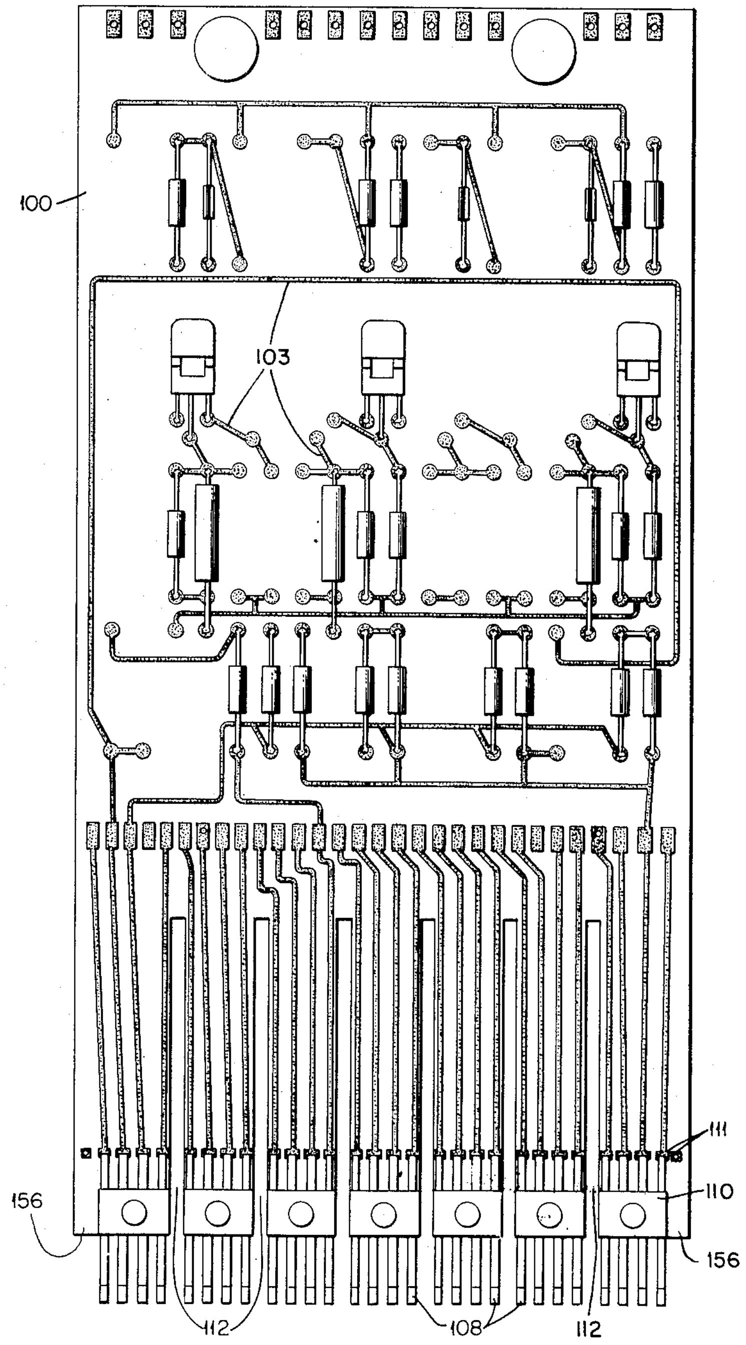

Fig. 6 is a view of one of the printed circuit component boards.

Figure 1:
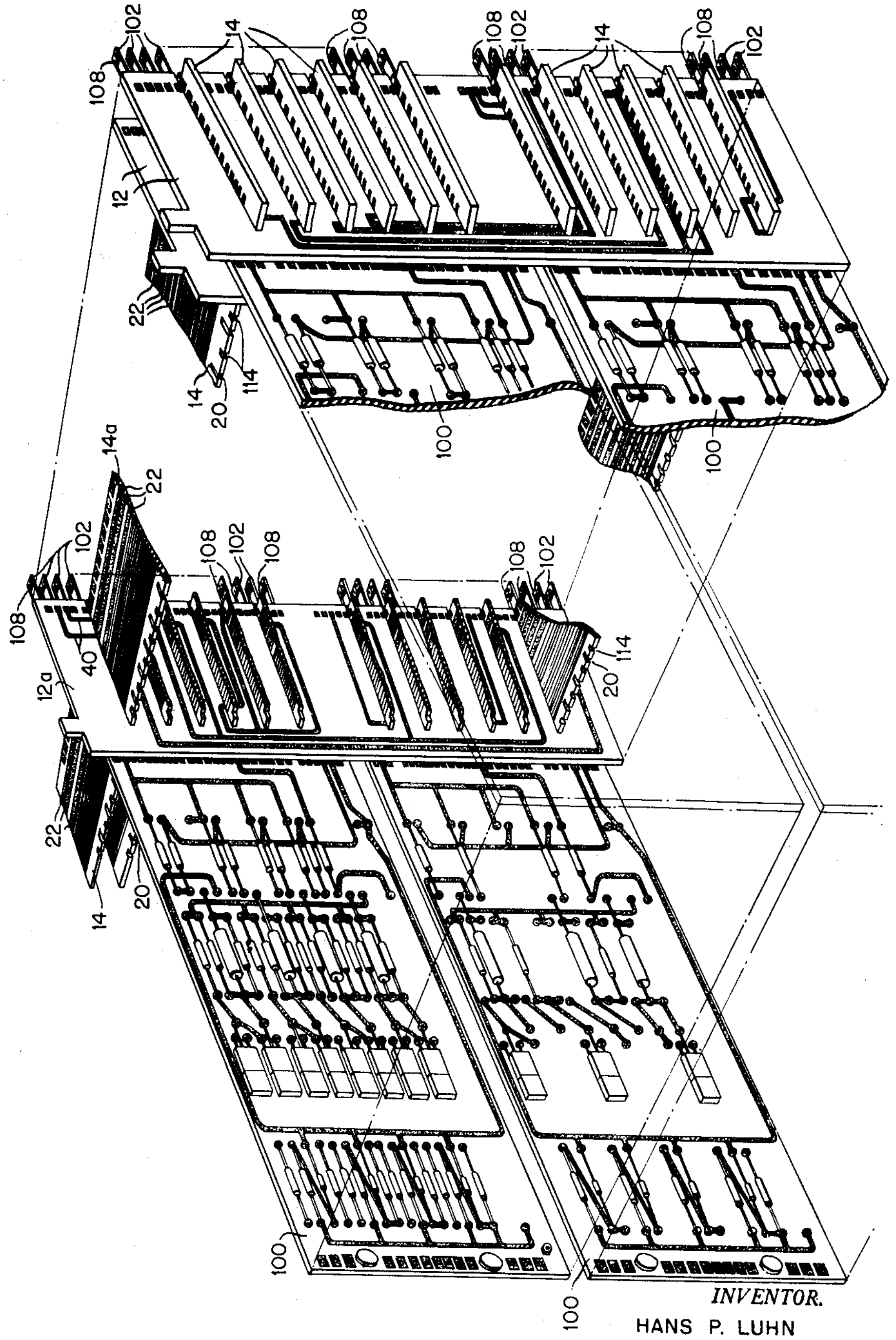
Fig. 1 is an isometric view of the novel multidimensional printed circuit and printed wiring assembly with parts broken away to more clearly show the inner construction.
Figure 2:
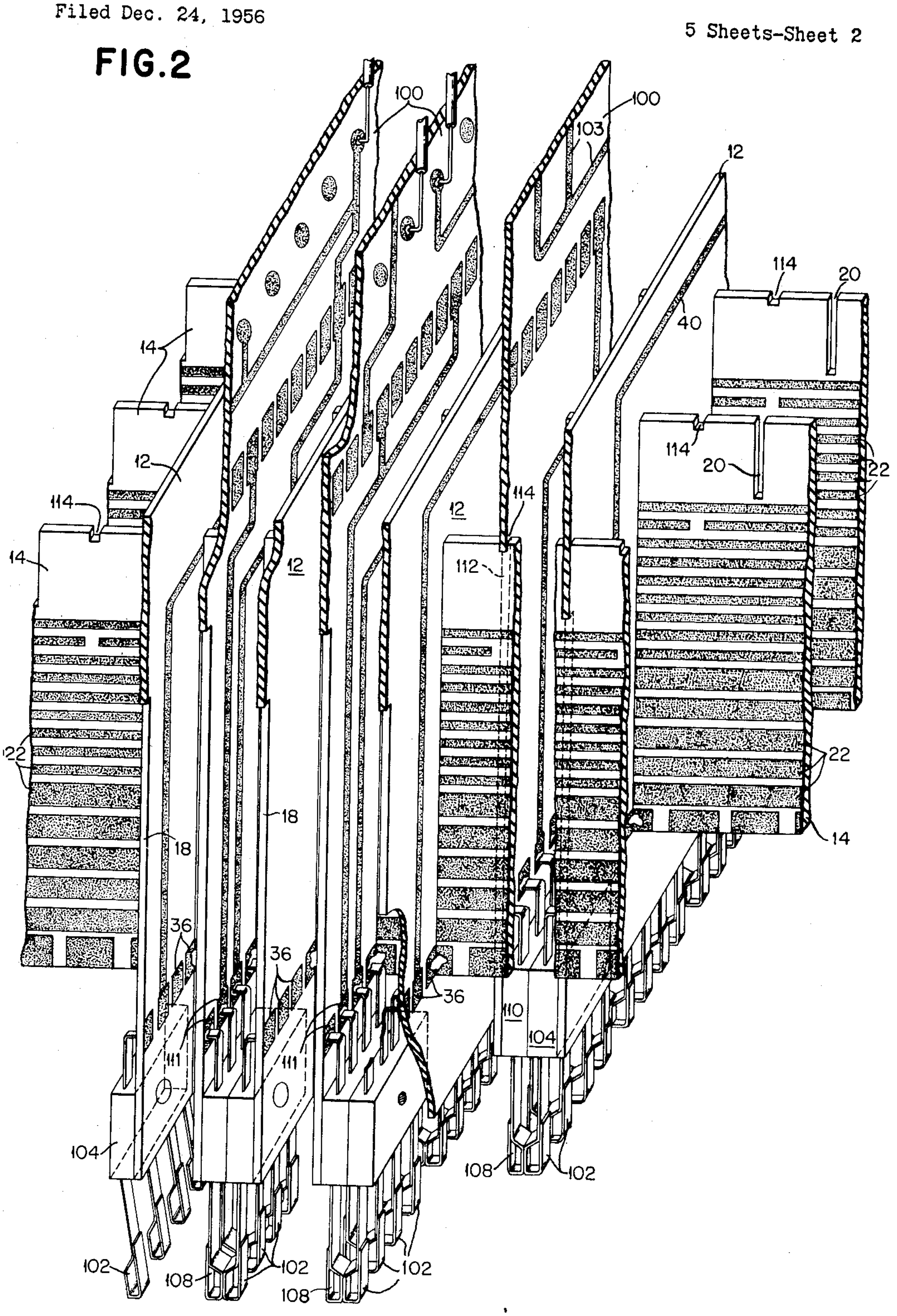
Fig. 2 is a front section of a portion of the assembly with parts broken away to show in detail the manner in which the boards are fitted together and the reeds fused to complete electrical connections.

As has been mentioned above the novel packaging concepts of the present invention may be employed to advantage with a three dimensional printed back panel wiring assembly such as is shown and described in the copending application Serial No. 630,102 and such a package utilizing this structure is herein disclosed and described by way of a preferred embodiment. The three dimensional structure of the copending application is not here described in detail but like reference numerals are here employed to designate structure which is similar in both applications. The three dimensional back panel wiring assembly includes, as is shown in Fig. 1, a plurality of vertical printed wiring boards 12 and a plurality of horizontal printed wiring boards 14. The boards 12 are provided with slots 18 and the boards 14 with slots 20 so that they may be fitted together to form a unified three dimensional assembly. Where it is desired to effect a connection between printed wiring on the vertical and horizontal boards, conductors 22 and 40 on the horizontal boards 14 and vertical boards 12, respectively, are printed so that they will be in adjoining relationship when the boards are fitted together and all such connections may be completed by a single dip soldering operation after the boards are assembled. An example of conductors printed in this manner is shown at the intersection of the boards designated **12*a* and 14*a* in Fig. 1. The connections to component boards 100 are, in accordance with the principles of the present invention, made on the rear side of the printed wiring assembly which is the side opposite that from which the major portions of these boards extend. Thus there is no need to provide the vertical boards 12 with U-shaped connectors to receive two component boards. Instead the boards 12 are provided with reeds 102 which, as illustrated in Figs. 1 and 2, extend from the rear of the assembly. These reeds are connected to pads 36 which terminate the printed wiring paths on the boards 12 and serve to apply the service voltages to and interconnections between the component boards 100. Pads 36 are provided on both sides of the boards 12 and are connected by plated holes so that connections from conductors on either side of the boards may be connected to the reeds. The reeds 102 are mounted in plastic blocks 104 which are riveted to the boards 12. The reeds may be riveted to the boards before the dip soldering of the back panel assembly so that the connections between pads 36 and reeds 102** may also be soldered during this operation and the extending ends of the reeds coated with solder.

Fig. 6 shows a printed circuit compact board 100 such as may be mounted on the three dimensional back panel wiring structure. Component boards may include transistors, resistors and other circuit elements connected by printed conductors 103 to form various functional circuits. The board 100 is, as shown, also provided with reeds which are designated 108 and which extend from the lower end of the board as viewed in Fig. 6. These reeds are of the same construction as those mounted on the vertical boards 12, being mounted in blocks 110 which are riveted to the component boards and having their upper extensions bearing against and soldered to pads 111 which terminate the printed wiring on the component boards. The extending ends of reeds 108 may be coated with solder during this soldering operation.

The component boards are provided with slots 112 between the groups of reeds 108. These slots may be larger than the thickness of the horizontal boards 14 so that the component boards may be inserted in the back panel wiring assembly formed by boards 12 and 14 without directly contacting any of the printed wiring on these boards. Slots 114 (Fig. 2) are provided in the horizontal boards 12 which serve to register the component boards in proper position. It should be noted that it is not necessary to use slotted component boards but the structures may be designed so that the openings between adjacent horizontal boards is sufficient to allow entire component boards to be inserted therebetween.

When the component boards are initially inserted, the blocks 110 thereon are aligned with blocks 104 mounted on the vertical boards 12 and the reeds 102 and 108 mounted in the blocks are also aligned. The opposing reeds are biased so that they are separated by a small space as is indicated in Fig. 5A. The first step in the fusing of these reeds is to clamp them together which may be accomplished by clamps such as are shown at 116 in Fig. 5B. After the reeds have been clamped, heat is focused from a linear heat source, such as a caloric rod, or heat lamp 118 on the contacting surfaces of the aligned opposing rows of reeds 102 and 108 thereby melting the solder, which is the fusing agent in the illustrative embodiment, on these members. The heat lamp is then extinguished allowing the solder to solidify and fuse together the opposing reeds 102 and 108. The clamps 116 are then removed and the opposing reeds remain connected as shown in Fig. 5D. When the reeds are thus fused together the flat surfaces of the opposing blocks 104 and 110 are, because of the bias of the reeds 102 and 108, held against each other thereby holding the boards 100 in proper parallel relationship with the vertical boards 12 and together with the slots 114 serving to support the component boards 100 on the back panel wiring assembly.

Figure 3:
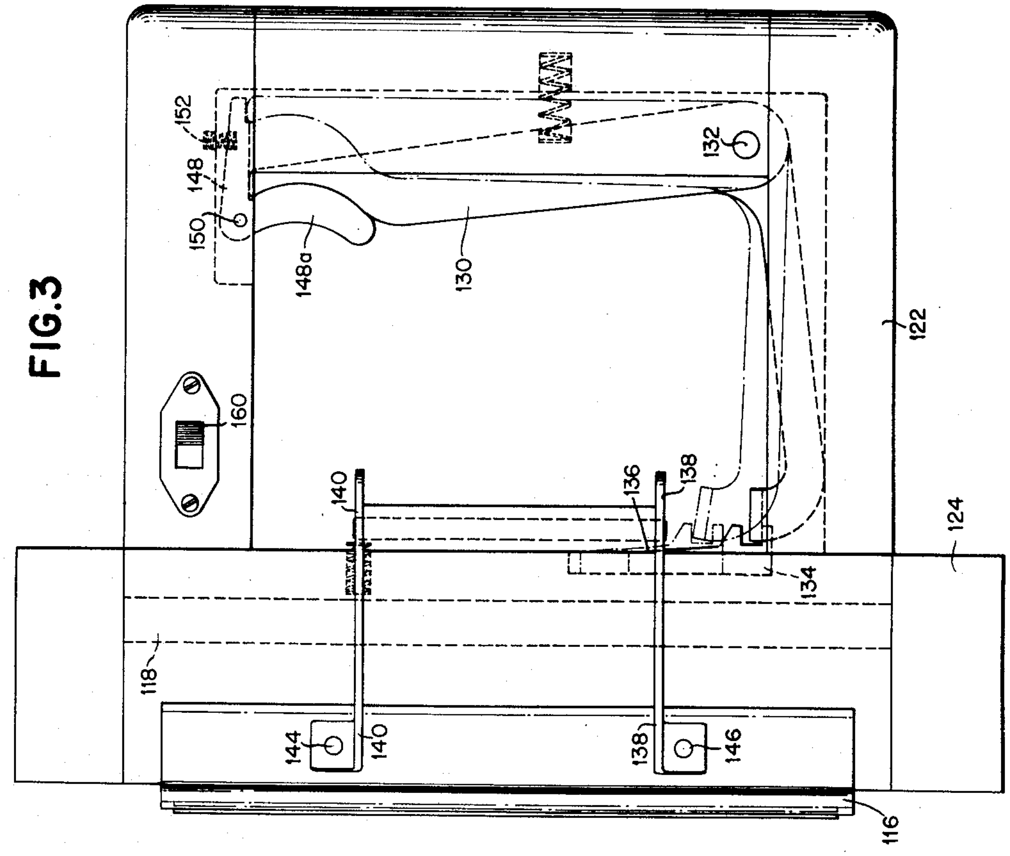
Fig. 3 shows the novel tool which may be employed to fuse the connecting reeds.
Figure 4:
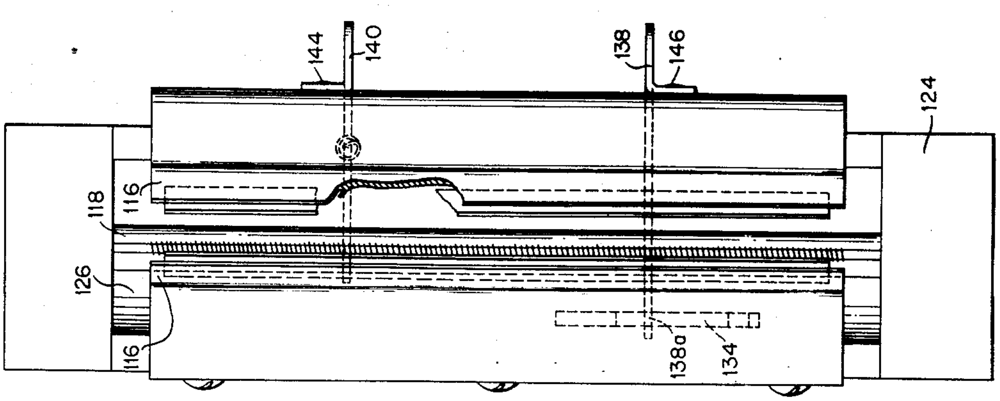
Fig. 4 is a front view of the tool shown in Fig. 3.

There is shown in Fig. 3 a side view of a special tool which may be employed to advantage in simultaneously fusing together groups of opposing reeds 102 and 108. The tool comprises a handle 122 secured to a block 124. A heat lamp 118 is mounted within an elliptically shaped opening in the block 124. The inner surface of the block 124 is designated 126 in Fig. 4, and is polished so that it reflects the light supplied by heat lamp 118. The surface 126 is an elliptical cylindrical surface and may be considered to be made up of a plurality of adjacent elemental ellipses. Each ellipse has two foci and the loci of these two foci of the elemental ellipses which make up the elliptical cylindrical surface 126 are defined by two straight lines. The lamp 120 is located along one of these lines so that the light supplied thereby will be concentrated along the second of the lines defining the location of the foci of the elemental ellipses. It is along this second line of foci that the reeds 102 and 108 which are to be fused, are located when the tool is placed so that clamps 116 are on either side of the reeds. The length or height of the opening between clamps 116, as viewed in Fig. 4, is sufficient to accommodate the reeds 108 on a single component board such as shown in Fig. 6.

When the tool is thus placed with the clamps 116 on either side of the reeds 102 and 108 to be fused, the clamps may be closed by operating a lever 130. This lever is pivotally connected at 132 to the tool handle 122 and, when operated, is pivoted in a clockwise direction so that its lower end, which engages a slidable rod 134, is effective to move the rod upward as viewed in Fig. 4. Rod 134 is provided with a camming surface which, when the rod is thus moved upward, bears against one end **138*a* of an arm 138 (see Fig. 4). Arm 138 is connected to a pivot rod 140 as is a second arm 140 and, when the camming surface on rod 134 bears against the end 138*a* of rod 138, the other ends of arms 138 and 148 are moved toward the block 124. These arms are connected at 144 and 146 to the right-hand one of the clamps 116 as viewed in Fig. 4. This clamp is thus moved toward the opposing clamp which is held stationary, thereby gripping the reeds 102 and 108** in the manner shown in Fig. 5B.

A detent 148, pivoted at 150 and normally biased in a clockwise direction by a spring 152, locks the lever 130 after it is operated. The reeds 102 and 108 are thus held in a line which represents the loci of the second foci of the series of adjacent elemental ellipses which make up reflecting surface 126. It should here be noted that the boards may be provided with shoulders such as those designated 156 in Fig. 6 which bear against the block 124 to properly position the reeds along the desired line of foci.

When the reeds are thus clamped, a switch 160 is operated to complete a circuit through the lamp 118 causing light and thus heat to be concentrated on the line along which the opposing reeds 102 and 108 are held together. The solder on these reeds is thus melted after which the lamp may be extinguished. The reeds 102 and 108 are then allowed to cool and the solder to solidify. The clamps may then be opened by operating an extension 148*a* of detent 148 thereby releasing arm 130. Springs 162 and 164 return lever 130, arms 138 and 140, and the associated linkage to their original position. The tool may then be removed and where, for any reason, the solder connection is not of proper quality, the initial bias on reeds 102 and 108 is such that they will fly apart, thus giving visible indication of the failure.

Advantages of the above method of soldering, other than the fact that a plurality of individual solder connections may be made in a single operetion, which might not be readily apparent, are herein noted. First, since the heat is supplied by light and there is no instrument brought into contact with the elements being soldered, there is no danger of introducing foreign materials which might have deleterious effects on the connection. Further, since the reeds to be soldered are located at the same place during each operation, a predetermined amount of heating for a predetermined time may be applied for each soldering operation to thereby repeatedly achieve optimum solder connections. Further, note should be made of the fact that these advantages may be realized in electrically connecting contacts in many types of assembly and the method is not limited to open type three dimensional assemblies such as is here shown by way of illustration.

Printed circuit packages assembled in the manner described are not limited in the frequency or the magnitude of the signal which they can reliably transmit since the connections throughout the system are soldered. Further, since all of the connections between component boards and the back panel wiring assembly are made at the rear of the package, servicing, testing and maintenance of the unit can be accomplished with a minimum of difficulty. These advantages have been realized without completely sacrificing all of the advantages inherent in employing pluggable components. This is so, since any component bords 100 may be removed with the special tool merely by placing the tool in position over the connected reeds 102 and 108 and operating switch 160 with clamps 116 open. As the solder is melted the reeds will spring apart and the component board may be replaced and a new board or the same board, after repair, may be inserted and soldered in a single operation in the manner described above.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intentions therefore, to be limited only as indicated by the scope of the following claims.

What is claimed is:

1. A printed circuit package comprising an assembly of first and second groups of intersecting cards having conductors thereon, said cards in said first group extending substantially at right angles to said cards in said second group, said cards in each of said groups being spaced to provide openings extending between the cards, a third plurality of cards having conductors thereon mounted on said cards in said first group on one side of said assembly and having contacting members extending through different ones of said openings between said cards in said first and second groups to the other side of said assembly, connectors on cards in said second group extending at said other side of said assembly, and means electrically coupling said connectors to said contact members.

2. A printed circuit package comprising an assembly of first and second groups of mutually perpendicular intersecting printed circuit cards arranged to provide openings from one side of the assembly to the other, a third group of printed circuit cards having components mounted thereon on one side of said assembly and having portions extending through said openings to said other side of said assembly, and means completing electrical connection between printed conductors on said portions of said cards in said third group and cards in said assembly on said other side of said assembly.

3. A printed circuit package comprising an assembly of first and second groups of mutually perpendicular intersecting printed circuit cards arranged to provide openings from one side of the assembly to the other, a third group of printed circuit cards having their major portions extending on said one side of said assembly but having portions thereof extending through said openings, said portions having connectors extending at said other side of said assembly, said cards in said first group having connectors extending at said other side of said assembly connected to said connectors on said portions of said cards in said third group.

4. The invention as claimed in claim 3 wherein said connectors on said portions of said cards in said third group and said connectors on said cards in said second group to which they are connected are biased to spring away from each other but are electrically and mechanically held together by a fusing agent.

5. A printed wiring package comprising an assembly of mutually perpendicular intersecting conductor carrying boards for supporting and providing interconnections between component circuits on a further group of conductor carrying boards, said further group of boards mounted on one side of said assembly but having finger-like members extending through said assembly to the other side thereof, and means connecting said conductors on said component circuit boards to said conductors on certain of said boards in said assembly only at said other side of said assembly.

6. A circuit package comprising a first group of boards having printed conductors thereon extending in spaced parallel relationship in a first direction, a second group of boards having conductors thereon extending in spaced parallel relationship in a second direction substantially perpendicular to said first direction, said boards in said first group intersecting said boards in said second group and conductors on said boards in said first group being connected to conductors on said boards in said second group at said intersections, a third group of boards having conductors thereon extending in parallel spaced relationship in said first direction and mounted on one side of said boards in said second group, said boards in said third group having members extending through openings between said spaced boards in said first and second groups from one end of the openings to the other, and first and second groups of parallel connectors on said boards in said second group and said members of said boards in said third group, respectively, said connectors extending outwardly of said other ends of said openings and being connected to the conductors on the boards from which they extend.

7. A circuit package comprising first and second boards each having conductors thereon, said boards being mounted in parallel spaced relationship, a first plurality of contacts on said first board connected to conductors thereon and having ends extending away fron one end of said first board, a second plurality of contacts on said second board connected to conductors thereon and having ends extending away from one end of said second board, the extending ends of said contacts in said first plurality being located opposite the extending ends of contacts in said second plurality, said opposing contacts being biased to spring away from each other but mechanically and electrically connected by solder joints therebetween.

8. A circuit package comprising first, second and third boards each having conductors thereon, said first and second boards being arranged in intersecting perpendicular relationship, one of said first and second boards having a slot thereon in which said other of said first and second boards is fitted at the intersection thereof, certain of said conductors on said first and second boards being electrically connected at said intersection, said third board being arranged in parallel spaced relationship with said first board and having a slot thereon fitted over said second board, each of said first and third boards having contact members connected to conductors thereon and extending away from corresponding ends of the respective boards, said contact members extending from said first board being located opposite contact members on said third board, said opposing contact members being biased to spring away from each other but mechanically and electrically connected by solder joints therebetween.

9. A method of fabricating a circuit package comprising the steps of arranging a first group of printed conductor boards in parallel spaced relationship, arranging a second group of printed conductor boards in parallel spaced relationship with each other and intersecting said boards in said first group so that conductors on said boards in said first group are at the intersections adjoining conductors on said boards in said second group, immersing said boards in a solder bath to thereby connect said adjoining conductors, inserting a third group of printed conductor boards having finger-like contacting members from one side of said arrangement of intersecting boards so that said contact members extend through different openings between said intersecting boards to the opposite side of said arrangement of intersecting boards, and connecting conductors on said boards in said third group with conductors on boards in at least one of said other groups at said other side of said arrangement of intersecting boards.

10. A method of fabricating a circuit package comprising the steps of arranging a first group of printed conductor boards in parallel spaced relationship, arranging a second group of printed conductor boards in parallel spaced relationship with each other and intersecting said boards in said first group so that conductors on said boards in said first group are at the intersections adjoining conductors on said boards on said second group, inserting a further printed conductor board having finger-like contacting members from one side of said arrangement of intersecting boards so that said contact members extend through different openings between said intersecting boards to the opposite side thereof, and connecting conductors on said further board to conductors on at least one of said first and second groups at said other side of said arrangement of intersecting boards.

11. A method of fabricating a circuit package comprising the steps of providing conductors on first, second and third boards, connecting biased contact members coated with solder to said first and third boards to contact conductors thereon and extend away from ends of said boards, arranging said first and second boards in mutually perpendicular intersecting relationship with surfaces of said boards and conductors thereon in adjoining relationship at the intersection, arranging said third board in parallel spaced relationship with said first board with the contact members extending therefrom opposite contact members extending from said first board and with the bias on said contact members tending to keep said opposing contact members separated, clamping said opposing contact members together, placing a linear light source in the vicinity of said clamped contact members for a time sufficient to liquify the solder thereon, subsequently unclamping said contact members after a time sufficient to allow the solder to solidify thereby fusing the opposing contact members together.

12. A circuit package comprising first, second and third groups of boards each having conductors thereon, said boards in each of said first and second groups being arranged in spaced parallel relaitonship and said boards in said first group being arranged to intersect said boards in said second group at substantially right angles, the conductors on said boards on said first and second groups being in adjoining relationship at intersections thereof, said boards in said third group being provided with finger-like members and mounted with said members in interdigitated relationship with said boards in said first and second groups, and means extending between said boards in said first group and said members of said boards in said third group for interconnecting conductors thereon.

References Cited in the file of this patent

UNITED STATES PATENTS

| | | |
|---|---|---|
| 1,091,479 | Bucknam | Mar. 31, 1914 |
| 2,071,808 | Anderson | Feb. 23, 1937 |
| 2,226,745 | Schrack | Dec. 31, 1940 |
| 2,701,346 | Powell | Feb. 1, 1955 |
| 2,731,609 | Sobel | Jan. 17, 1956 |
| 2,774,014 | Henry | Dec. 11, 1956 |
| 2,799,837 | Powell | July 16, 1957 |
| 2,832,013 | Pedersen | Apr. 22, 1958 |

FOREIGN PATENTS

| | | |
|---|---|---|
| 714,125 | France | Nov. 7, 1931 |
| 203,624 | Australia | June 7, 1956 |